(12) United States Patent
Yamada et al.

(10) Patent No.: US 9,556,374 B2
(45) Date of Patent: Jan. 31, 2017

(54) RARE-EARTH REGENERATOR MATERIAL PARTICLES, AND GROUP OF RARE-EARTH REGENERATOR MATERIAL PARTICLES, REFRIGERATOR AND MEASURING APPARATUS USING THE SAME, AND METHOD FOR MANUFACTURING THE SAME

(75) Inventors: Katsuhiko Yamada, Yokohama (JP); Keiichi Fuse, Yokohama (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 386 days.

(21) Appl. No.: 13/391,831

(22) PCT Filed: Aug. 23, 2010

(86) PCT No.: PCT/JP2010/064180
§ 371 (c)(1),
(2), (4) Date: Feb. 23, 2012

(87) PCT Pub. No.: WO2011/024757
PCT Pub. Date: Mar. 3, 2011

(65) Prior Publication Data
US 2012/0157320 A1 Jun. 21, 2012

(30) Foreign Application Priority Data
Aug. 25, 2009 (JP) ................. 2009-194832

(51) Int. Cl.
| G01R 33/035 | (2006.01) |
|---|---|
| C09K 5/08 | (2006.01) |
| F25B 9/14 | (2006.01) |
| B22F 9/10 | (2006.01) |
| C09K 5/14 | (2006.01) |
| B22F 9/08 | (2006.01) |
| H01F 1/01 | (2006.01) |

(52) U.S. Cl.
CPC . *C09K 5/08* (2013.01); *B22F 9/08* (2013.01); *B22F 9/10* (2013.01); *C09K 5/14* (2013.01); *F25B 9/14* (2013.01); *H01F 1/015* (2013.01); *C22C 2202/02* (2013.01); *F25B 2309/003* (2013.01); *Y10T 428/12014* (2015.01)

(58) Field of Classification Search
CPC ........................................ C09K 5/08
USPC ........................................ 505/162
See application file for complete search history.

(56) References Cited

U.S. PATENT DOCUMENTS

| 4,415,511 A * | 11/1983 | Bourdeau ............ 75/334 |
|---|---|---|
| 5,186,765 A | 2/1993 | Arai et al. |
| 5,449,416 A * | 9/1995 | Arai et al. ............ 148/301 |
| 5,593,517 A | 1/1997 | Saito et al. |
| 6,460,348 B2 | 10/2002 | Okamura et al. |
| 2001/0025494 A1 | 10/2001 | Okamura et al. |
| 2004/0013593 A1 | 1/2004 | Takagimi et al. |
| 2004/0110016 A1 | 6/2004 | Hamaya et al. |
| 2004/0231124 A1* | 11/2004 | Morimoto et al. ...... 29/419.1 |
| 2008/0104967 A1 | 5/2008 | Satoh |
| 2011/0213042 A1* | 9/2011 | Labuschagne ........ 518/728 |

FOREIGN PATENT DOCUMENTS

| JP | 3 174486 | 7/1991 | |
|---|---|---|---|
| JP | 5 171228 | 7/1993 | |
| JP | 7 133480 | 5/1995 | |
| JP | 11 294882 | 10/1999 | |
| JP | 2001 272126 | 10/2001 | |
| JP | 2002 318021 | 10/2002 | |
| JP | 2003 73661 | 3/2003 | |
| JP | 2004 315352 | 11/2004 | |
| JP | 2006 242484 | 9/2006 | |
| WO | WO 2009/016579 | * 2/2009 | ........ B01J 37/00 |

OTHER PUBLICATIONS

International Preliminary Report on Patentability Issued Mar. 13, 2012 in PCT/JP10/64180 Filed Aug. 23, 2010.
International Search Report Issued Nov. 9, 2010 in PCT/JP10/64180 Filed Aug. 23, 2010.
Extended European Search Report dated Sep. 21, 2015, issued in EP Application No. 10811807.6, 5 pp.

* cited by examiner

*Primary Examiner* — Paul Wartalowicz
(74) *Attorney, Agent, or Firm* — Oblon, McClelland, Maier & Neustadt, L.L.P.

(57) ABSTRACT

Provided is a group of rare-earth regenerator material particles having an average particle size of 0.01 to 3 mm, wherein the proportion of particles having a ratio of a long diameter to a short diameter of 2 or less is 90% or more by number, and the proportion of particles having a depressed portion having a length of ⅒ to ½ of a circumferential length on a particle surface is 30% or more by number. By forming the depressed portion on the surface of the regenerator material particles, it is possible to increase permeability of an operating medium gas and a contact surface area with the operating medium gas.

16 Claims, 4 Drawing Sheets

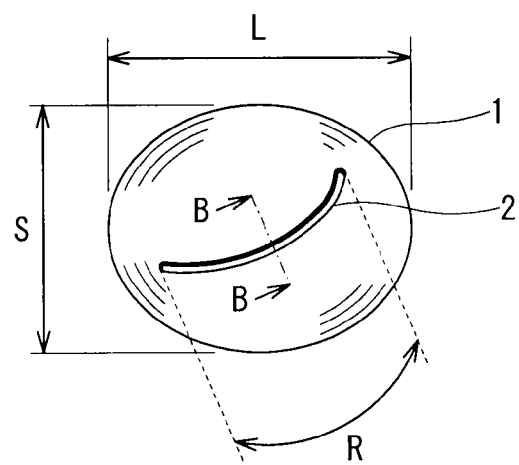
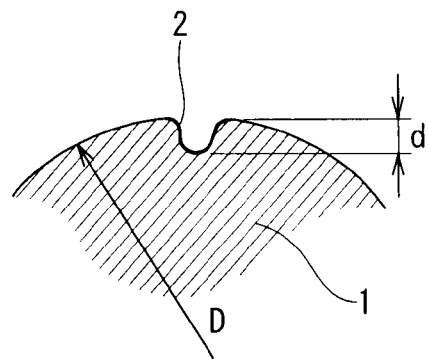
FIG. 1A          FIG. 1B
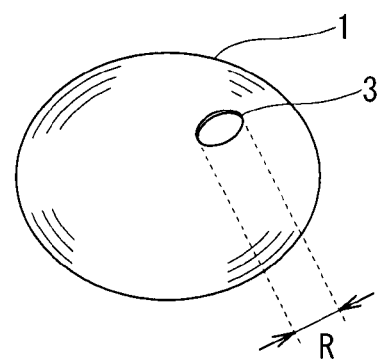
FIG. 2

RARE-EARTH REGENERATOR MATERIAL PARTICLES, AND GROUP OF RARE-EARTH REGENERATOR MATERIAL PARTICLES, REFRIGERATOR AND MEASURING APPARATUS USING THE SAME, AND METHOD FOR MANUFACTURING THE SAME

TECHNICAL FIELD

The present invention relates to regenerator material (cold accumulating material) particles and a group of regenerator material particles, and particularly relates to a rare-earth regenerator material, a refrigerator and a measuring apparatus using the regenerator material, and a method for manufacturing the regenerator material.

BACKGROUND ART

In the field of superconducting technology used in a magnetic floating train, a fracture diagnostic apparatus based on nuclear magnetic resonance, or the like, cryogenic technology has been progressed remarkably for various applications including a cryopump used in an ultra-high vacuum apparatus such as a VLSI pattern transfer apparatus. As it has come to the stage of putting the cryogenic technology to practical use, a smaller refrigerator having a higher performance has been progressively developed and realized practically. Especially, there is increasing importance in freezing and cooling techniques for developing an environment having a temperature around the absolute zero temperature (−273° C.) at which the cryopump for creating a high vacuum atmosphere in a superconducting magnet or a semiconductor manufacturing apparatus is operated, and there is a strong demand for a refrigerator exhibiting a high reliability and excellent characteristics.

Conventionally, in a superconducting MRI (nuclear magnetic resonance imaging) apparatus (image measuring apparatus) used for taking tomograms in the medical field, a small refrigerator using helium, such as a Gifford MacMahon type refrigerator (GM refrigerator) has been employed in order to cool and refrigerate the superconducting magnet.

The GM refrigerator is composed of combination of a compressor for compressing He gas, an expansion unit for expanding the compressed He gas, and a regenerator unit (cold accumulating unit) for keeping the He gas cooled in the expansion unit in the cooled state. In the refrigerator, the He gas compressed by the compressor is expanded to be cooled by about 60 cycles per minute, and then, a system to be cooled is cooled through a tip end portion of the expansion unit of the refrigerator.

Alternatively, there have been developed pulse tube refrigerators in recent years. The pulse tube refrigerator is a refrigerator in which high-pressure He gas is provided to the refrigerator in a prescribed period. Since the pulse tube refrigerator has a smaller vibration in comparison with the GM refrigerator, the pulse tube refrigerator has the advantage of suppressing noise generation at measurement in, for example, an MRI apparatus.

In refrigerators used for any purpose, the regenerator unit is filled with a regenerator material (cold accumulating material). As the regenerator material for refrigerator used in an extremely low temperature region around the absolute zero temperature, for example, of 10K or less, further of 4K or less, a rare-earth regenerator material disclosed in Japanese Patent No. 2609747 (Patent Document 1) is technically effective. The technique disclosed in the Patent Document 1 involves adjusting the particle size and the aspect ratio of rare-earth regenerator material particles, and thereby enables high-density filling of the regenerator material particles.

On the other hand, studies for employing multi-staged regenerator units have been made in view of improving performance of the refrigerator. For example, Japanese Patent Laid-Open No. 2001-272126 (Patent Document 2) discloses a two-staged pulse tube refrigerator. By employing multi-staged regenerator units, it is possible to attain a higher cooling velocity (refrigerating speed). It is also possible to attain a larger cooling amount, thereby the refrigerator can be installed in a larger-scaled apparatus. By employing the multi-staged regenerator units, He gas must be supplied in a larger amount at a higher pressure.

The refrigerating performance of a refrigerator depends on amount of He gas having contact with the surface of the regenerator material particles. As the regenerator material particles, particles having a spherical shape have been conventionally used in view of realizing high-density filling, and therefore, it is difficult to fill the particles at a higher density than ever before. Although there is a conceivable measure of filling the space between the regenerator material particles with smaller regenerator material particles, filling particles in an excessively large amount leads to a decrease in permeability of He gas serving as a cooling medium. Another measure of filling the particles under a high pressure is also conceivable; however, filling under an excessively high pressure leads to crushing of the regenerator material particles, which rather causes clogging in a cooling system. Therefore, there is a technical demand for a regenerator material capable of ensuring the high-density filling and attaining a larger contact surface area with the He gas.

CITATION LIST

Patent Document

Patent Document 1: Japanese Patent No. 2609747
Patent Document 2: Japanese Patent Laid-Open No. 2001-272126

SUMMARY OF INVENTION

Problems to be Solved by the Invention

The present invention has been made to solve the above described problems and an object of the present invention is to provide rare-earth regenerator material particles capable of ensuring high-density filling and attaining a larger contact surface area with an operating medium gas such as He gas. Another object of the present invention is to provide a method for effectively manufacturing the rare-earth regenerator material particles having a larger contact specific surface area.

Means for Solving the Problems

The present invention provides a group of rare-earth regenerator material particles having an average particle size of 0.01 to 3 mm, wherein the proportion of particles having a ratio of a long diameter to a short diameter of 2 or less is 90% or more by number, and the proportion of particles having a depressed portion having a length of $1/10$ to $1/2$ of a particle circumferential length on a particle surface is 30% or more by number.

Moreover, it is preferable that the depressed portion has a depth of $1/10$ or less of a particle diameter. Furthermore, it is preferable that the rare-earth regenerator material particles are composed of at least one selected from Nd, $Er_3Ni$, and $HoCu_2$.

The present invention provides rare-earth regenerator material particles, having a particle size of 0.01 to 3 mm, having a ratio of a long diameter to a short diameter of 2 or less, and having a depressed portion having a length of 1/10 to 1/2 of a particle circumferential length on a particle surface.

The group of rare-earth regenerator material particles described above is suitable for use in a refrigerator comprising a regenerator container (cold accumulating unit) filled with the group of rare-earth regenerator material particles. In addition, it is preferable that the regenerator container comprises two or more stages of regenerator material-filled zones through a mesh material.

The group of rare-earth regenerator material particles described above is suitable for use in a measuring apparatus comprising a superconducting magnet comprising the refrigerator. In addition, it is preferable that the measuring apparatus is at least one of an MRI (magnetic resonance imaging apparatus) and an NMR (nuclear magnetic resonance analyzer).

The present invention provides a first method for manufacturing a group of rare-earth regenerator material particles, comprising a step of preparing a molten metal containing a rare-earth element, a step of supplying the molten metal to a rotary disk having a rotating velocity of 7000 to 11000 rpm in a chamber under an argon atmosphere, and a step of rapidly cooling (quenching) the molten metal having a granular form flipped by the rotary disk. In addition, it is preferable that the molten metal is supplied through a jetting hole having a diameter of 0.05 to 2 mm. Moreover, it is preferable that the rotary disk is made of ceramic. Furthermore, it is preferable that the molten metal is supplied after preliminarily heating the rotary disk to a temperature of 800° C. or more.

The present invention provides a second method for manufacturing a group of rare-earth regenerator material particles, comprising a step of preparing a molten metal containing a rare-earth element, a step of jetting the molten metal from a rotary nozzle having a rotating velocity of 7000 to 11000 rpm in a chamber under an argon atmosphere, and a step of rapidly cooling (quenching) the molten metal having a granular form jetted from the rotary nozzle. In addition, it is preferable that the molten metal is supplied through a jetting hole having a diameter of 0.05 to 2 mm. Furthermore, it is preferable that the molten metal is jetted after preliminarily heating the rotary nozzle to a temperature of 800° C. or more.

Advantages of the Invention

According to the group of rare-earth regenerator material particles of the present invention, it is possible to ensure high-density filling (packing) and attain a larger contact surface area between the group of regenerator material particles and an operating medium gas such as He gas. As a result, characteristics of the refrigerator using the group of regenerator material particles and characteristics of the measuring apparatus using the refrigerator can be greatly improved.

According to the method for manufacturing the group of rare-earth regenerator material particles of the present invention, it is possible to manufacture the group of rare-earth regenerator material particles of the present invention effectively. By using the rare-earth regenerator material particles of the present invention, it is possible to form the group of rare-earth regenerator material particles effectively.

BRIEF DESCRIPTION OF THE DRAWINGS

FIG. 1A is a perspective view illustrating one example of rare-earth regenerator material particle of the present invention and FIG. 1B is a magnified cross sectional view taken in the direction of the arrows along the line B-B in FIG. 1A.

FIG. 2 is a perspective view illustrating another example of rare-earth regenerator material particles of the present invention.

DESCRIPTION OF EMBODIMENTS

Figure 3:
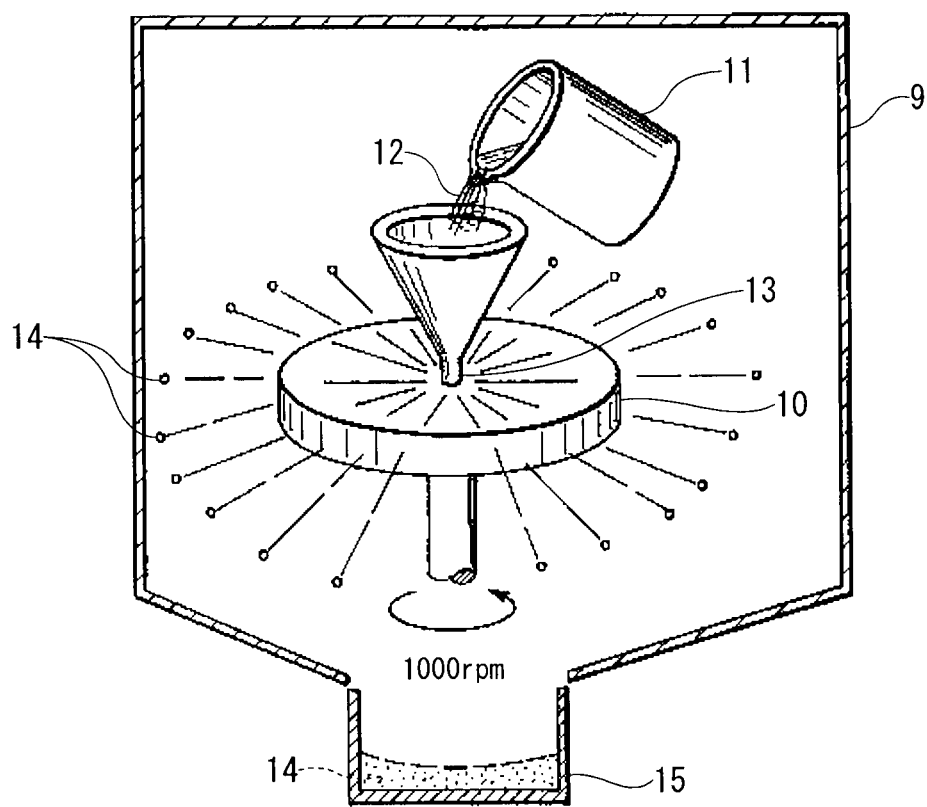
FIG. 3 is a cross sectional perspective view illustrating one example of a method for manufacturing the rare-earth regenerator material particles of the present invention.

A group of rare-earth regenerator material particles of the present invention is a group of rare-earth regenerator material particles having an average particle size of 0.01 to 3 mm, in which the proportion of particles having a ratio of a long diameter to a short diameter of 2 or less is 90% or more by number, and the proportion of particles having a depressed portion having a length of 1/10 to 1/2 of a particle circumferential length on a particle surface is 30% or more by number.

The rare-earth regenerator material comprises a rare-earth element as a constituent element. Examples of the rare-earth element may include at least one or two or more selected from Y (yttrium), La (lanthanum), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), and ytterbium (Yb).

Examples of the rare-earth regenerator material may be composed of a rare-earth elemental of single substance, an alloy with Cu (including an intermetallic compound), an alloy with Ni (including an intermetallic compound), a rare-earth oxide (including a rare-earth complex oxide), and a rare-earth sulfide. Examples of a constituent material of the rare-earth regenerator material particles include Nd, $Er_3Ni$, ErNi, $HoCu_2$, $Gd_2O_3$, and $Gd_2O_2S$.

The group of rare-earth regenerator material particles has an average particle size of 0.01 to 3 mm. When the average particle size is less than 0.01 mm, the regenerator material particles filled in a regenerator container have an excessively small space therebetween, which leads to a decrease in permeability of an operating medium gas (He gas). On the other hand, when the average particle size exceeds 3 mm, the regenerator material particles have an excessively large space therebetween, and therefore, a sufficient contact surface area with the operating medium gas cannot be ensured. It is more preferable that the group of regenerator material particles has an average particle size of 0.1 to 0.5 mm. When the average particle size is in the above range, both of the permeability of the operating medium gas and the contact surface area can be increased. The average particle size of the group of regenerator material particles is measured by a particle size distribution analyzer. A particle size D of the respective regenerator material particles is determined as (short diameter S+long diameter L)/2.

Moreover, in the group of regenerator material particles of the present invention, the proportion of particles having a ratio of the long diameter to the short diameter of 2 or less is defined as 90% or more by number. 90% or more by number of particles having an aspect ratio (L/S) of 2 or less indicates that the proportion of particles having a spherical shape close to a real spherical shape is large. When the proportion of particles having a spherical shape is large, the regenerator material particles can have point contact with each other, thereby the contact surface area between the group of regenerator material particles and the operating medium gas can be increased largely.

It is noted that when the proportion of regenerator material particles having a large aspect ratio is large, variation (scattering) in the space between the particles occurs, which leads to a decrease in the permeability of the operating medium gas, even if the rare-earth regenerator material particles have an average particle size of 0.01 to 3 mm. Furthermore, for example, when the particles having a large aspect ratio and then having an elongated shape are contained, a larger amount of the particles have contact with each other not at point but on surface, which reduces the contact surface area with the operating medium gas. As a result, the proportion of the particles having an aspect ratio of 2 or less is more advantageously higher, and is preferably 95% or more, more preferably of 100%.

The proportion of the regenerator material particles having an aspect ratio (long diameter/short diameter) of 2 or less is measured by the following procedure. A magnified picture of 200 particles of the regenerator material particles is taken, the long diameter L and the short diameter S of the respective regenerator material particles in the picture are measured as shown in FIG. 1A, the number of particles having an aspect ratio (L/S) of 2 or less is counted, and the objective proportion is determined by the formula below.

(number of particles having an aspect ratio of 2 or less/200)×100(%)

In the present invention, the group of rare-earth regenerator material particles having the aforementioned average particle size and the aforementioned aspect ratio is further characterized in that the proportion of particles having a depressed portion having a length of $1/10$ to $1/2$ of a particle circumferential length on a particle surface is 30% or more by number. Here, the particle circumferential length is defined as an equatorial length ($\pi D$) of the spherical particle having the particle size described above.

FIGS. 1 and 2 show examples of regenerator material particles 1 having depressed portions 2 and 3. In FIGS. 1A and 1B, a channel-shaped depressed portion 2 is formed on a surface of the rare-earth regenerator material particle 1 in a range having a length R. In FIG. 2, a hole-shaped depressed portion 3 is formed on a surface of the rare-earth regenerator material particle 1 having a length R. It is noted that the shape of the depressed portion can be selected from various shapes including a channel shape and a hole shape. In the case of forming the hole-shaped depressed portion 3 having a length R shown in FIG. 2 in plural numbers, a total of lengths R1, R2, and —which are the length of depressed portions 3, 3, and—respectively is taken as "the length R of the depressed portion".

The length R of the depressed portion is set to be a length of $1/10$ to $1/2$ of the circumferential length ($\pi D$) on the particle surface. When the length R of the depressed portion is less than $1/10$ of the circumferential length, the depressed portion becomes excessively small and the surface area of the regenerator material particles cannot be increased.

On the other hand, when the length R of the depressed portion exceeds $1/2$ of the particle circumferential length, the depressed portion becomes excessively large, which leads to a decrease in structural strength of the regenerator material particles. If the structural strength decreases, there may be posed a problem that the regenerator material particles are liable to be easily broken by impact or vibration resulting from action for filling the regenerator material particles into the regenerator container or from operation of a refrigerator. The length R of the depressed portion is more preferably $1/10$ to $1/3$ of the particle circumferential length.

Although the depressed portion may be formed in plural numbers, the number of the depressed portion per one regenerator material particle is 2 or less, preferably 1 because an excessive amount of the depressed portion leads to a decrease in the structural strength of the regenerator material particles. In addition, as shown in FIG. 1B, when a depth d of the depressed portion 2 is excessively large, the structural strength of the regenerator material particles 1 decreases, even if the number of the depressed portion 2 is 1. Therefore, it is preferable that the depth d of the depressed portion is $1/10$ or less of the diameter (the particle size D) of the regenerator material particles 1.

The length R of the depressed portion is measured by the following procedure. A magnified picture of the respective regenerator material particles 1 is taken, and the diameter D of the particle 1 and the length R of the depressed portion in the picture are measured. It is noted that, in the case of regenerator material particles having an elliptic shape, the circumferential length ($\pi D$) is obtained by taking (long diameter L+short diameter S)/2 as the diameter D. Also, as for the depth d of the depressed portion 2, 3, a method using a magnified picture is available. An example of such a method includes a method using an AFM magnifying glass (microscope).

In the present invention, the regenerator material particles 1 having the aforementioned depressed portions 2, 3 is contained at a proportion of 30% or more based on the total number of the particles. The number of the regenerator material particles having the depressed portion is measured by the following procedure. A magnified picture of 200 particles is taken, the number of the regenerator material particles having the depressed portion in the picture is measured, and the objective number is determined by the formula (number of regenerator material particles having depressed portion/200)×100(%). This procedure is performed on another 200 particles three times, and an average thereof is taken as the proportion, by number, of the particles having the depressed portion.

When the proportion of the regenerator material particles having the depressed portion is less than 30% by number, an increase in the contact surface area between the regenerator material particles and the operating medium gas is small. It is more preferable that the proportion of the regenerator material particles having the prescribed depressed portion is 50% or more and 100% or less by number.

The group of rare-earth regenerator material particles in which the proportion, by number, of the regenerator material particles having the prescribed depressed portion is adjusted as mentioned above is suitable for use in a refrigerator for providing an environment having a temperature in an extremely low temperature region of 10K or less, further of 4K or less.

The refrigerator comprises a regenerator container (cold accumulating unit) for filling regenerator material particles. The refrigerator comprises the regenerator container filled with the aforementioned regenerator material particles. It is also possible to employ a multi-staged refrigerator by connecting two or more regenerator containers or by forming two or more regenerator material-filled zones through a mesh material in the regenerator container. In the multi-staged refrigerator, a volume of the regenerator material-filled zone can be increased because of the multi-staged configuration, thereby refrigerating performance can be improved drastically.

In the refrigerator of the present invention, the regenerator container is filled with the group of rare-earth regenerator material particles of the present invention, in the case of a one-staged refrigerator. In the case of the multi-staged refrigerator, at least one of the regenerator material-filled zones (cooling stages) is filled with the group of rare-earth regenerator material particles of the present invention. In the multi-staged refrigerator, although it is preferable to fill all of the regenerator material-filled zones with the group of rare-earth regenerator material particles of the present invention, another regenerator material-filled zone may be filled with another type of regenerator material depending on refrigerating performance required. An Example of another type of regenerator material may include mesh material comprising a metal mesh material composed of copper, a copper alloy, or the like.

The refrigerating performance of the refrigerator depends on how effective the operating medium gas such as He gas has contact with the regenerator material particles. In the group of rare-earth regenerator material particles of the present invention, the particles have a spherical shape with the depressed portion formed thereon, thereby the high-density filling of the regenerator material particles can be ensured, resistance to permeation (flow resistance) of the operating medium gas is not increased, and the contact surface area between the operating medium gas and the regenerator material particles can be increased. Especially, such a refrigerator is suitable for use as a refrigerator in which the operating medium gas moves back and forth with a high pressure such as the multi-staged refrigerator.

Also, such a refrigerator is suitable for use as a refrigerator for operating a superconducting magnet. Superconducting technology is used in a magnetic floating train, a nuclear magnetic resonance apparatus, and the like. Especially, the nuclear magnetic resonance apparatus is used in a wide variety of applications including an MRI apparatus for a human body, an NMR apparatus for a non-human body. Moreover, such a refrigerator can be also applied in a cryopump used for a semiconductor manufacturing apparatus. In any of the above cases, the refrigerating performance of the refrigerator can be improved, which leads to improvement in reliability and characteristics of the measuring apparatus.

Next, a description is given of a method for manufacturing a group of rare-earth regenerator material particles of the present invention. An example of the method for manufacturing a group of rare-earth regenerator material particles of the present invention includes a method of mixing the rare-earth regenerator material particles having the depressed portion and rare-earth regenerator material particles not having the depressed portion in specified amounts.

As a method other than the above method, an effective method for manufacturing the group of rare-earth regenerator material particles of the present invention is described below.

FIG. 3 shows one example of the manufacturing method. FIG. 3 is a cross sectional perspective view illustrating a configuration of a manufacturing apparatus based on Rotary Disc Process (RDP) in which a molten metal is dispersed by a disk-shaped rotary body and then solidified. The manufacturing apparatus comprises a cooling chamber 9, a disk-shaped rotary body 10, a ladle 11, a molten metal 12, a pouring nozzle 13, (a group of) rare-earth regenerator material particles 14, and a particle collection vessel 15.

In the rapid cooling (quenching) apparatus using a rotary disk based on the Rotary Disc Process shown in FIG. 3, first, a molten metal comprising the rare-earth element and another component as needed in specified amounts is prepared. Another component is Ni in the case of $Er_3Ni$ and Cu in the case of $HoCu_2$. That is, the molten metal containing the same constituent element as that of the objective rare-earth regenerator material is prepared.

The molten metal 12 is poured into the ladle 11, and then, supplied to the disk-shaped rotary body (rotary disk) 10 from the pouring nozzle 13. The molten metal 12 is flipped on the disk-shaped rotary body 10 rotating at a high velocity, and then, falls in the cooling chamber 9 with being cooled and solidified rapidly to be the rare-earth regenerator material particles 14. The rare-earth regenerator material particles 14 fall into the particle collection vessel 15, thus forming the group of rare-earth regenerator material particles.

In order to manufacture the group of regenerator material particles having an average particle size of 0.01 to 3 mm, it is preferable to set a diameter of a jetting hole formed on the pouring nozzle to 0.05 to 2 mm. Moreover, it is preferable that the disk-shaped rotary body 10 has a rotating velocity of 7000 to 11000 rpm. The average particle size of the obtained rare-earth regenerator material particles is controlled by adjusting the rotating velocity and the size of the jetting hole (pouring nozzle 13).

In the above manufacturing method, it is preferable that the disk-shaped rotary body 10 has a high rotating velocity of 7000 rpm or more. On the other hand, an upper limit of the rotating velocity is preferably 11000 rpm because an excessively large rotating velocity facilitates formation of regenerator material particles having an aspect ratio more than 2.

It is preferable that the molten metal 12 flipped by the disk-shaped rotary body 10 is rapidly cooled (quenched) in an argon atmosphere. By employing the argon atmosphere, it is possible to inhibit mixing in of an impurity gas component (oxygen or nitrogen). Nitrogen gas cannot be used as the atmosphere of the cooling chamber because nitrogen gas reacts with the molten metal when used as an inert gas. For the same reason, air cannot be also used.

The molten metal 12 after dispersed is cooled at such a rate that a temperature is lowered from 1000° C. to room temperature in 10 seconds or less, preferably in 5 seconds or less. There may be a case where an initial temperature of the molten metal 12 may exceed 1000° C. because the temperature of the molten metal 12 varies depending on the material. Furthermore, it is preferable that an interior of the cooling chamber 9 is coated with a heat resistant resin. By employing the coating using a resin, it is possible to inhibit mixing in of an impurity metal when the rare-earth regenerator material particles have contact with the interior. In the same manner, it is also preferable that an interior of the particle collection vessel 15 is coated with a resin. By inhibiting mixing in of the impurity gas component and the impurity metal component, it is possible to attain such a small content as a oxygen content of 100 ppm or less, a nitrogen content of 20 ppm or less, an Al content of 50 ppm or less, and a Si content of 30 ppm or less.

In the above method for manufacturing the group of rare-earth regenerator material particles of the present invention, the molten metal 12 is supplied to the rotary disk rotating at a high velocity of 7000 to 11000 rpm from the pouring nozzle 13 comprising the jetting hole having a diameter of 0.05 to 2 mm. The molten metal having a granular form flipped by the rotary disk 10 is cooled rapidly. The molten metal having a granular form flipped swiftly by the rotary disk 10 rotating at a prescribed rotating velocity is rapidly cooled with keeping the granular form. At this point, the molten metal having a granular form is rapidly cooled from its direction of movement after flipped. Since the cooling chamber 9 is sealed with the argon atmosphere, the molten metal having a granular form is formed into the rare-earth regenerator material particles 14 with being subjected to flow resistance of the argon atmosphere.

Here, since the molten metal having a granular form is subjected to the flow resistance, the particle is dispersed and cooled with engulfing the argon gas on the back of its direction of movement, and the engulfment of the argon gas causes the channel-shaped depressed portion. Therefore, it is possible to control the shape of the channel-shaped depressed portion 2 by adjusting the rotating velocity of the rotary disk 10 and the diameter of the pouring nozzle 13 related to an input amount of the molten metal 12. In addition, the hole-shaped depressed portion 3 shown in FIG. 2 is formed by instant collision between the molten metals having a granular form during dispersion and cooling of the flipped molten metals having a granular form.

In addition, it is preferable that the rotary disk 10 is made of ceramic. Examples of the ceramic may include alumina ($Al_2O_3$) and boron nitride (BN). When the rotary disk 10 is made of a metal, there is a fear that a metal impurity is mixed in the rare-earth regenerator material.

Moreover, it is preferable that the molten metal 12 is supplied after preliminarily heating the rotary disk 10 to a temperature of 800° C. or more. When the rotary disk 10 is not heated, the molten metal 12 is rapidly cooled at the moment when the molten metal 12 comes in contact with the rotary disk 10, and the molten metal 12 adheres to the rotary disk 10. In order to flip the molten metal 12 smoothly and uniformly, it is preferable to preliminarily heat the rotary disk 10 to a temperature of 800° C. or more. It is noted that although there is no restriction on an upper limit of a temperature of the preliminary heating, the upper limit is preferably 1000° C. When the temperature of the preliminary heating is excessively high, there is a fear that the cooling chamber 9 comes to have a high temperature because the rotary disk 10 may be installed in the cooling chamber 9 as shown in FIG. 3, and the rapidly cooling step (quenching step) of the molten metal 12 is performed insufficiently.

Examples of the method of the preliminary heating may include a method of installing a heater to the rotary disk 10 and a method of preliminarily heating the rotary disk 10 by bringing the rotary disk 10 into contact with the molten metal 12 which is a raw material of the rare-earth regenerator material particles for a certain period of time. Also in view of the need of the preliminary heating, it is preferable that the rotary disk 10 is made of ceramic.

Furthermore, the rotary disk 10 has a diameter preferably of 20 to 100 mm. When the diameter is less than 20 mm, the rotary disk is small, and therefore, there is a possibility that the molten metal 12 directly falls without touching the rotary disk 10 unless the molten metal 12 is supplied after accurately aligned the position. Especially, in the case of installing the particle collection vessel 15 at the bottom of the cooling chamber 9, attention has to be paid because an obtained product becomes defective. On the other hand, when the diameter of the rotary disk 10 exceeds 100 mm, there is a fear that the rotary disk 10 comes to hold an excessive heat by the preliminary heating, and then, the cooling chamber 9 is heated, which results in an adverse effect on the cooling step.

Figure 4:
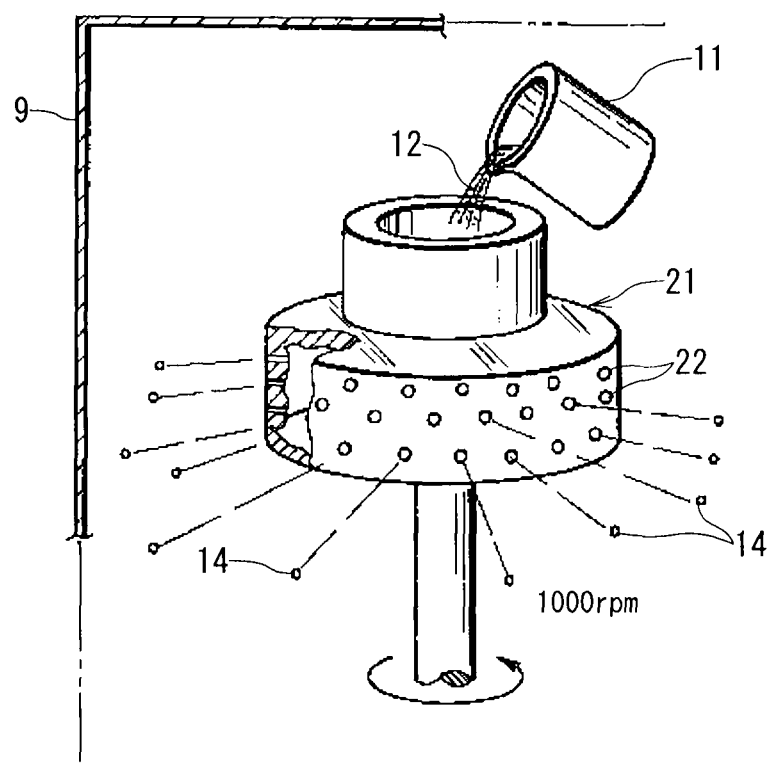
FIG. 4 is a cross sectional perspective view illustrating another example of a method for manufacturing the rare-earth regenerator material particles of the present invention.

FIG. 4 shows another example of the manufacturing method. FIG. 4 is a cross sectional perspective view illustrating a configuration of an apparatus for manufacturing a group of regenerator material particles based on rotary nozzle process in which a molten metal is dispersed by a rotary nozzle 21 having a jetting hole 22 and then solidified. The manufacturing apparatus comprises a cooling chamber 9, a ladle 11, a molten metal 12, (a group of) rare-earth regenerator material particles 14, a rotary nozzle 21, and a jetting hole 22.

The molten metal is prepared by the same process as that described above.

At a side surface of the rotary nozzle 21, a small hole (jetting hole) 22 is formed. The molten metal 12 dashes out from the jetting hole 22 as a molten metal having a droplet form by rotating the rotary nozzle 21 at a high velocity. The molten metal 12 after dashing out from the jetting hole 22 falls in the cooling chamber 9 with being rapidly cooled to be the rare-earth regenerator material particles 14. The rare-earth regenerator material particles 14 fall into a particle collection vessel (not shown), thus forming the group of rare-earth regenerator material particles 14.

In order to manufacture the group of regenerator material particles 14 having an average particle size of 0.01 to 3 mm, it is preferable to set a diameter of the jetting hole 22 formed on the rotary nozzle 21 to 0.05 to 2 mm. Moreover, it is preferable that the disk-shaped rotary nozzle 21 has a rotating velocity of 7000 to 11000 rpm. The average particle size of the obtained rare-earth regenerator material particles is controlled by adjusting the rotating velocity and the size of the jetting hole 22. An upper limit Of the rotating velocity is preferably 11000 rpm because an excessively large rotating velocity of the rotary nozzle 21 facilitates formation of regenerator material particles having an aspect ratio more than 2.

It is preferable that the molten metal 12 having a granular form after dashing out from the jetting hole 22 is rapidly cooled (quenched) in an argon atmosphere. By employing the argon atmosphere, it is possible to inhibit mixing in of an impurity gas component (oxygen or nitrogen). The molten metal having a granular form 12 is cooled at such a rate that a temperature is lowered from 1000° C. to room temperature in 10 seconds or less, preferably in 5 seconds or less. It is noted that an initial temperature may exceed 1000° C. because the temperature of the molten metal varies depending on the material. Moreover, it is preferable that an interior of the cooling chamber 9 is coated with a heat resistant resin. By employing the coating using a resin, it is possible to inhibit mixing in of an impurity metal when the rare-earth regenerator material particles have contact with the interior. In the same manner, it is also preferable that an interior of the particle collection vessel is coated with a resin. By inhibiting mixing in of the impurity gas component and the impurity metal component, it is possible to attain such a small content as an oxygen content of 100 ppm or less, a nitrogen content of 20 ppm or less, an Al content of 50 ppm or less, and a Si content of 30 ppm or less.

Even in the case of using the rapidly cooling apparatus based on rotary nozzle comprising the rotary nozzle 21 as shown in FIG. 4, it is preferable to preliminarily heat the rotary nozzle 21 to a temperature of 800° C. or more. By means of preliminary heating, it is possible to prevent the molten metal 12 from being cooled beyond necessity in the rotary nozzle 21. Although there is no restriction on an upper limit of a temperature of the preliminary heating for the rotary nozzle 21, the upper limit is preferably 1000° C. When the temperature of the preliminary heating is excessively high, there is a fear that the cooling chamber 9 comes to have a high temperature because the rotary nozzle 21 may be installed in the cooling chamber 9, and then, the rapidly cooling step is performed insufficiently.

In the method based on rotary nozzle, it is possible to manufacture a lager amount of the regenerator material particles at one time in comparison with the method based on rotary disk by forming a plurality of jetting holes 22 at the side surface of the rotary nozzle 21. The rotary nozzle 21 has a diameter preferably of 10 to 50 cm.

In the method for manufacturing a group of regenerator material particles of the present invention, there often exist the particles having the depressed portion and particles not having the depressed portion. In order to extract only the rare-earth regenerator material particles having the depressed portion from the group of the particles, a method of screening by rolling the particles at a specified inclined surface is available. When the depressed portion is formed on the particle surface, the particle rolls down at a higher velocity in comparison with the particle without the depressed portion because a surface friction becomes slightly smaller. It is also possible to screen by using the difference in the falling velocity.

When it is difficult to apply the rapid cooling and solidifying method in the case of rare-earth oxide particles, rare-earth oxysulfide particles, and the like, a method of polishing a surface of a sintered body obtained by a sintering process to obtain specified particles and then forming the depressed portion required can be applied.

EXAMPLES

Examples 1 to 6 and Comparative Example 1

A molten metal was prepared by using Ho and Cu at a ratio corresponding to $HoCu_2$. Next, droplets of the molten metal 12 was supplied on a ceramic rotary disk 10 from a pouring nozzle 13 and then flipped by the ceramic rotary disk 10 in a rapidly cooling (quenching) apparatus based on rotary disk shown in FIG. 3, thus manufacturing groups of rare-earth regenerator material particles 14 of the Examples and the Comparative Example. It is noted that a rapidly cooling operation was performed under an argon atmosphere at such a cooling rate that the temperature was lowered from 1000° C. to room temperature in 5 seconds or less. The manufacturing process was performed on the conditions shown in Table 1 including a shape of the pouring nozzle (a diameter of a jetting hole) and a rotating velocity of the rotary disk. A cooling chamber 9 with an interior coated with a resin was used.

In Comparative Example 1, the manufacturing process was performed on the condition of a lower rotating velocity of 2000 rpm.

TABLE 1

| Sample No. | Pouring Nozzle Diameter of Jetting Hole (mm) | Rotary Disk Diameter (mm) | Rotation Velocity (rpm) | Pre-heating Temperature (° C.) |
|---|---|---|---|---|
| Example 1 | 1.5 | 35 | 9000 | 970 |
| Example 2 | 1.5 | 35 | 8000 | 900 |
| Example 3 | 1.5 | 50 | 11000 | 1000 |
| Example 4 | 0.5 | 50 | 9000 | 850 |
| Example 5 | 2.0 | 80 | 9500 | 1050 |
| Example 6 | 1.5 | 30 | 7000 | 500 |
| Comparative Example 1 | 1.5 | 50 | 2000 | 800 |

For each of the groups of rare-earth regenerator material particles manufactured on the conditions shown in Table 1, the average particle size, the proportion (proportion by number) of regenerator material particles having an aspect ratio of 2 or less, and the proportion (proportion by number) of particles having a depressed portion having a length of $\frac{1}{10}$ to $\frac{1}{2}$ of a circumferential length on a particle surface were measured. Each of the parameters was measured by the aforementioned procedure. The results are shown in Table 2.

TABLE 2

| Sample No. | Average Particle Size (μm) | Proportion of Particle Having Aspect Ratio of 2 or less (Proportion by Number %) | Proportion of Particles Having Depressed Portion Having Length of $\frac{1}{10}$ to $\frac{1}{2}$ of Circumferential Length on Particle Surface (Proportion by Number %) | Depth d of Depressed Portion/ Particle Diameter D (d/D) |
|---|---|---|---|---|
| Example 1 | 200 | 100 | 80 | $\frac{1}{10}$ or less |
| Example 2 | 240 | 99 | 67 | $\frac{1}{10}$ or less |
| Example 3 | 130 | 96 | 95 | $\frac{1}{10}$ or less |
| Example 4 | 45 | 98 | 84 | $\frac{1}{10}$ or less |
| Example 5 | 310 | 96 | 85 | $\frac{1}{10}$ or less |
| Example 6 | 270 | 90 | 56 | $\frac{1}{7}$ |
| Comparative Example 1 | 550 | 75 | 10 | $\frac{1}{10}$ or less |

As is evident from the results shown in Tables 1 and 2, the groups of regenerator material particles manufactured by the methods of the Examples of the present invention each had the prescribed depressed portion. In addition, it was confirmed that there existed both of a channel-shaped depressed portion and a hole-shaped depressed portion. Moreover, it was also confirmed that when the temperature of preliminary heating (pre-heating) was lower as in Example 6, the particles have a depressed portion having a larger depth. On the contrary, when the rotating velocity was small as in Comparative Example 1, the proportion of regenerator material particles having an aspect ratio of 2 or less was drastically decreased. Furthermore, in Comparative Example 1, the depressed portion was formed in a smaller amount because argon was engulfed in a smaller amount.

Examples 7 to 12 and Comparative Example 2

A molten metal was prepared by using Ho and Cu at a ratio corresponding to $HoCu_2$. Next, on the conditions and specifications of a rotary nozzle shown in Table 3, the molten metal 12 was supplied to a rotary nozzle 21 from a pouring nozzle and jetted through a plurality of jetting holes 22 formed on a side surface of the rotary nozzle 21, and then, rapidly cooled in an atmosphere gas in a rapidly cooling apparatus based on rotary nozzle shown in FIG. 4, thus manufacturing groups of rare-earth regenerator material particles of the Examples and the Comparative Example. It is noted that the rapidly cooling operation was performed under an argon atmosphere at such a cooling rate that the temperature was lowered from 1000° C. to room temperature in 5 seconds or less. The conditions of a shape of the jetting hole and a rotating velocity were shown in Table 3. A cooling chamber 9 with an interior coated with a resin was used.

TABLE 3

| | Rotary Nozzle | | | |
|---|---|---|---|---|
| Sample No. | Diameter of Jetting Hole (mm) | Diameter (cm) | Rotation Velocity (rpm) | Pre-heating Temperature (° C.) |
| Example 7 | 1.5 | 15 | 9500 | 930 |
| Example 8 | 1.5 | 15 | 8500 | 950 |
| Example 9 | 1.5 | 50 | 11000 | 820 |
| Example 10 | 0.5 | 30 | 9000 | 1000 |
| Example 11 | 2.0 | 30 | 8000 | 970 |
| Example 12 | 1.5 | 30 | 7200 | 450 |
| Comparative Example 2 | 1.5 | 30 | 1500 | 800 |

For each of the groups of rare-earth regenerator material particles manufactured on the conditions shown in Table 3, the average particle size, the proportion (proportion by number) of regenerator material particles having an aspect ratio of 2 or less, the proportion (proportion by number) of particles having a depressed portion having a length of $1/10$ to $1/2$ of a circumferential length on a particle surface, and a ratio of a depth (d) of the depressed portion to a particle size (D) were measured. Each of the parameters was measured by the aforementioned procedure. The results are shown in Table 4.

As is evident from the results shown in Table 4, the groups of rare-earth regenerator material particles of the Examples each had the prescribed depressed portion. In addition, it was confirmed that there existed both of a channel-shaped depressed portion and a hole-shaped depressed portion. Moreover, it was also confirmed that when the temperature of preliminary heating (pre-heating) was lower as in Example 12, the particles had a depressed portion having a larger depth. On the contrary, when the rotating velocity was small as in Comparative Example 2, although the proportion of regenerator material particles having an aspect ratio of 2 or less was high, the depressed portion was formed in a smaller amount because argon was engulfed in a smaller amount.

In comparison with the method based on rotary disk, the proportion of the particles having a depressed portion was lower. This is because the method based on rotary nozzle is a method in which the molten metal is jetted through the jetting hole in a granular form, whereas the method based on rotary disk is a method in which the molten metal is flipped by a disk rotating at a high velocity. The flipping operation is considered to be more effective for forming the depressed portion.

Examples 13 to 24 and Comparative Example 3

A GM refrigerator is manufactured by filling the respective groups of rare-earth regenerator material particles of Examples 1 to 12 and Comparative Example 1 in a regenerator container (cold accumulating unit) at a highest filling density (a filling rate of about 68%).

Figure 5:
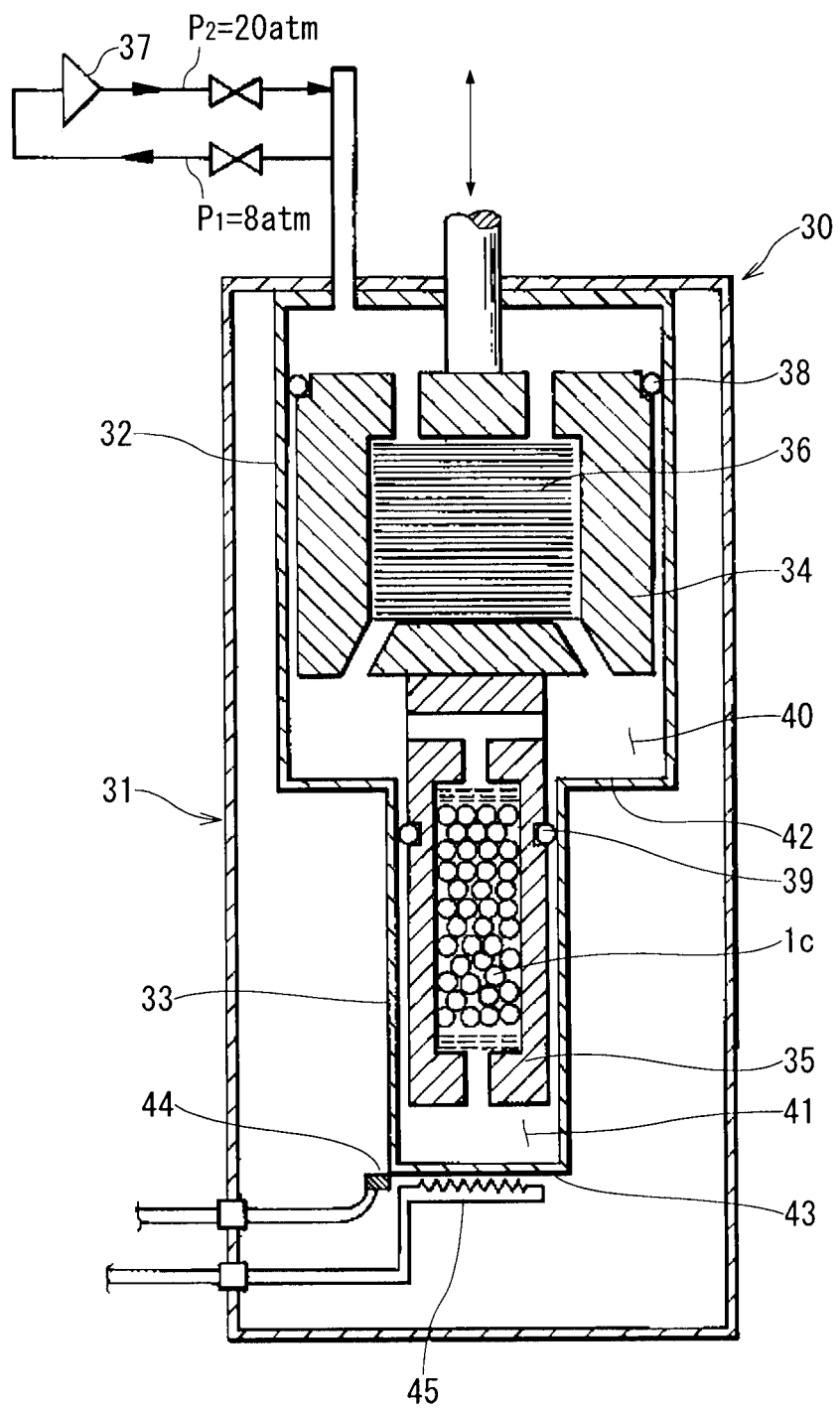
FIG. 5 is a cross sectional view illustrating one example of a configuration of a GM refrigerator.

Here, a configuration of the GM refrigerator for a test is shown in FIG. 5. As shown in FIG. 5, a GM refrigerator 30 is composed of external cylinders 32 and 33 arranged in series in a vacuum chamber 31, a first regenerator container 34 and a second regenerator container 35 installed to be movable back and forth in the external cylinders 32 and 33, respectively, a Cu mesh material 36 filled in the first regenerator container 34 as a first regenerator material, a second group of regenerator material particles (1c) of the Examples filled in the second regenerator container 35, and a compressor 37 for supplying He gas into the external cylinder 32.

Seal rings 38 and 39 are installed between the external cylinders 32, 33 and the first and the second regenerator containers 34, 35, respectively. In addition, a first expanding chamber 40 is formed between the external cylinder 32 and the first regenerator container 34 and a second expanding chamber 41 is formed between the external cylinder 33 and the second regenerator container 35. A first cooling stage 42

TABLE 4

| Sample No. | Average Particle Size (μm) | Proportion of Particles Having Aspect Ratio of 2 or less (proportion by Number %) | Proportion of Particles Having Depressed Portion Having Length of $1/10$ to $1/2$ of Circumferential Length on Particle Surface (Proportion by Number %) | Depth d of Depressed Portion/ Particle Diameter D (d/D) |
|---|---|---|---|---|
| Example 7 | 160 | 96 | 45 | $1/10$ or less |
| Example 8 | 180 | 93 | 52 | $1/10$ or less |
| Example 9 | 140 | 90 | 62 | $1/10$ or less |
| Example 10 | 48 | 88 | 41 | $1/10$ or less |
| Example 11 | 230 | 84 | 38 | $1/10$ or less |
| Example 12 | 170 | 80 | 34 | $1/6$ |
| Comparative Example 2 | 200 | 90 | 8 | $1/10$ or less | and a second cooling stage 43 are formed at the bottom of the first and the second expanding chambers 40 and 41, respectively.

Furthermore, in order to evaluate characteristics of the groups of regenerator material particles prepared in the Examples and the Comparative Example, a resistance thermometer 44 for measuring the temperature of the second cooling stage 43 and a heater 45 for subjecting a thermal load to the second cooling stage 43 are installed in the second cooling stage 43.

As the regenerator container, a cold accumulating unit having a size of a diameter of 50 mm×a length of 80 mm (a stainless pipe having a thickness of 1 mm) was used. For each of the refrigerators, permeability of an operating medium gas (He gas) and refrigerating performance (refrigerating capacity) were measured. The results are shown in Table 5. Here, the permeability was measured by the following procedure. After the refrigerator was operated for continuous 500 hours with supplying an operating medium gas having a heat capacity of 25 J/K at a mass flow rate of 3 g/sec and a gas pressure of 16 atm, the mass flow rate of the operating medium gas was measured. The permeability was represented by a relative value when the mass flow rate of Comparative Example 3 (a refrigerator using the regenerator material of Comparative Example 1) is taken as 100 (criterion value). A value larger than 100 indicates a relatively higher permeability.

The refrigerating performance of the group of regenerator material particles 1c was measured by the following procedure. The group of regenerator material particles 1c was filled in the second regenerator container 35, while the Cu mesh material 36 was filled in the first regenerator container 34, and the GM refrigerator 30 was operated at 60 cycles per minute. He gas compressed to 20 atm by the compressor 37 was adiabatically expanded repeatedly in the first expanding chamber 40 and the second expanding chamber 41. The generated cold heats are accumulated at the Cu mesh material 36 and the regenerator material 1c.

The refrigerating performance in the examples was defined as a thermal load at the point when the temperature of the second cooling stage 43 was elevated to stop at 6K with subjecting a thermal load to the second cooling stage 43 by the heater 45 during operation of the refrigerator. The results are shown in Table 5.

TABLE 5

| Sample No.. | Group of Rare Earth Regenerator material Particles | Peameability (Relative Value) | Refrigerating Performance (W) |
| --- | --- | --- | --- |
| Example 13 | Example 1 | 101 | 2.3 |
| Example 14 | Example 2 | 105 | 2.4 |
| Example 15 | Example 3 | 90 | 2.6 |
| Example 16 | Example 4 | 102 | 2.2 |
| Example 17 | Example 5 | 110 | 2.4 |
| Example 18 | Example 6 | 83 | 2.4 |
| Example 19 | Example 7 | 102 | 2.2 |
| Example 20 | Example 8 | 101 | 2.2 |
| Example 21 | Example 9 | 92 | 2.5 |
| Example 22 | Example 10 | 101 | 2.2 |
| Example 23 | Example 11 | 108 | 2.1 |
| Example 24 | Example 12 | 90 | 2.0 |
| Comparative Example 3 | Comparative Example 1 | 100 (Criterion Value) | 1.9 |

As is evident from the results shown in Table 5, the refrigerators of the Examples each had an improved refrigerating performance. This is because the formed depressed portion increased the contact surface area between the rare-earth regenerator material particles and He gas. The permeability was inferior in Examples 15 and 21. This is because a group of rare-earth regenerator material particles having a smaller average particle size in comparison with Comparative Example 3 was used in each of these Examples.

Furthermore, breakage of the regenerator material particles after 500 hours-operation was checked. The result was that no breakage was found in the Examples except Examples 18 and 24, and the Comparative Example. It was confirmed that the strength of the regenerator material particles was equal to or surpassing that of a conventional product.

On the other hand, in each of Examples 18 and 24, a slight crack was found in the regenerator material particle. As a result, it was found that the depth of the depressed portion was preferably 1/10 or less of the diameter.

Examples 25 to 27 and Comparative Example 4

Next, a two-staged pulse tube refrigerator was manufactured by using the regenerator material shown in Table 6, and the characteristics were measured by the same process. It is noted that the pulse tube refrigerator is operated on the conditions of a He gas pressure of 2.3 MPa at high pressure and a He gas pressure of 0.9 MPa at low pressure. As the regenerator container, a cold accumulating unit having a size of a diameter of 50 mm×a length of 100 mm (a stainless pipe having a thickness of 1 mm) was used.

TABLE 6

| Sample No. | Regenerator Material of First Cooling Stage | Regenerator Material of Secong Cooling Stage | Permeability (Relative Value) | Refrigerating Performance (W) |
| --- | --- | --- | --- | --- |
| Example 25 | Mixed Particle of Example 1 + Pb particles having Average Particle Size of 500 μm at Mixing ratio of 50:50 | Example 1 | 114 | 1.4 |
| Example 26 | Pb Particles Having Average Particle Size of 500 μm | Example 4 | 116 | 1.2 |
| Example 27 | Pb Particles Having Average Particle Size of 500 μm | Example 1 | 106 | 1.0 |
| Comparative Example 4 | Pb Particles Having Average Particle Size of 500 μm | Comparative Example 1 | 100 (Criterion Value) | 0.7 |

As is evident from the results shown in Table 6, the refrigerators using the regenerator materials of the Examples each had a higher permeability and an improved refrigerating performance. Especially, in Examples 25 and 26 in which the group of rare-earth regenerator material particles of the Example was used in both of the first and the second stages, an outstanding refrigerating performance could be obtained.

Examples 28 to 30

Examples in which the rare-earth regenerator material particles were changed to Nd, $Er_3Ni$, and ErNi were taken as Examples 28, 29, and 30, respectively, and the measurement was conducted by the same process. As a manufacturing method, the method based on rotary disk which is the same as in Example 1 was employed. The diameter of the jetting hole formed on the pouring nozzle, operation conditions and specifications of the rotary disk are shown in Table 7.

TABLE 7

| Sample No. | Composition of Rare Earth Refregerator Material | Pouring Nozzle Diameter of Jetting Hole (mm) | Rotary Disk Diameter (mm) | Rotation Velocity (rpm) | Pre-Heating Temperature (° C.) |
|---|---|---|---|---|---|
| Example 28 | Nd | 1.3 | 40 | 9000 | 950 |
| Example 29 | $Er_3Ni$ | 1.6 | 40 | 9000 | 950 |
| Example 30 | ErNi | 1.6 | 40 | 9000 | 950 |

For each of the groups of rare-earth regenerator material particles obtained in the Examples, the shape of the particles was measured by the same process as that in the aforementioned Examples. The results are shown in Table 8.

TABLE 8

| Sample No. | Average Particle Size (μm) | proportion of Particles Having Aspect Ratio of 2 or less (Proportion by Number %) | Proportion of Particles Having Depressed Portion Having Length of 1/10 to 1/2 of Circumferencial Length on Particle Surface (Proportion by Number %) | Depth d of Depressed Portion/ Particle Diameter (d/D) |
|---|---|---|---|---|
| Example 28 | 190 | 100 | 83 | 1/10 or less |
| Example 29 | 200 | 99 | 82 | 1/10 or less |
| Example 30 | 190 | 96 | 78 | 1/10 or less |

A refrigerator was manufactured by filling the respective groups of rare-earth regenerator material particles obtained in Examples 28 to 30 shown in Table 8 in a regenerator container of a GM refrigerator which was the same as that in Example 13. The permeability and the refrigerating performance were measured by the same process as that in Example 13. The results are shown in Table 9.

TABLE 9

| Sample No. | Group of Rare Earth Refregerator Material Particles | Pemeability (Relative value) | Refrigerating Performance (W) |
|---|---|---|---|
| Example 31 | Example 28 | 101 | 3.4 |
| Example 32 | Example 29 | 103 | 3.6 |
| Example 33 | Example 30 | 102 | 3.5 |
| Comparative Example 3 | Comparative Example 1 | 100 (Criterion Value) | 1.9 |

As is evident from the results shown in Table 9, the refrigerators using the groups of regenerator material particles of the Example each had a higher permeability and an improved refrigerating performance. As a result, it was found that the effect of the present invention could be exerted even if the material composition was changed.

INDUSTRIAL APPLICABILITY

According to the group of rare-earth regenerator material particles of the present invention, it is possible to ensure the high-density filling and attain a larger contact surface area between the group of regenerator material particles and the operating medium gas such as He gas. Therefore, it is possible to improve the characteristics of the refrigerator using the group of rare-earth regenerator material particles, further the characteristics of the measuring apparatus using the refrigerator.

According to the method for manufacturing a group of rare-earth regenerator material particles of the present invention, it is possible to effectively manufacture the group of rare-earth regenerator material particles of the present invention. By using the rare-earth regenerator material particles of the present invention, it is possible to form the group of rare-earth regenerator material particles effectively.

DESCRIPTION OF SYMBOLS

1 rare-earth regenerator material particles (rare-earth cold accumulating material particles)
2 channel-shaped depressed portion
3 hole-shaped depressed portion
9 cooling chamber
10 disk-shaped rotary body
11 ladle
12 molten metal
13 pouring nozzle
14 (group of) rare-earth regenerator material particles
15 particle collection vessel
30 GM refrigerator
31 vacuum chamber
32, 33 external cylinder
34 first regenerator container
35 second regenerator container
36 Cu mesh material
1C second group of regenerator material particles 37 compressor
38, 39 seal ring
40 first expanding chamber
41 second expanding chamber
42 first cooling stage
43 second cooling stage
44 resistance thermometer
45 heater

The invention claimed is:

1. Regenerator material particles, comprising a rare-earth metal and having an average particle size of 0.045 to 0.5 mm,
   wherein a proportion of particles having a ratio of a long diameter to a short diameter of 2 or less is 90% or more by number,
   a proportion of particles having a depressed portion having a length of ⅟₁₀ to ½ of a particle circumferential length on a particle surface is 30% or more by number and wherein the depressed portion has a depth of ⅟₁₀ or less of a particle diameter, and the depressed portion has a channel-shape or a hole-shape, and
   wherein the number of the depressed portion per one regenerator material particle is 1 or 2.

2. The particles of claim 1, comprising at least one selected from the group consisting of Nd, $Er_3Ni$, and $HoCu_2$.

3. The particles of claim 1, comprising Nd.

4. The particles of claim 1, comprising $Er_3Ni$.

5. The particles of claim 1, comprising $HoCu_2$.

6. The particles of claim 1, wherein the number of the depressed portion per one regenerator material particle is 2.

7. The particles of claim 1, wherein the number of the depressed portion per one regenerator material particle is 1.

8. A method for manufacturing regenerator material particles according to claim 1, the method comprising a rare-earth metal, the method comprising:
   (a) heating a metal comprising a rare-earth element, to obtain a molten metal, and preliminarily heating a rotary disk to a temperature of 800° C. or more;
   (b) supplying the molten metal to a rotary disk having a rotating velocity of 7000 to 11000 rpm in a chamber under an argon atmosphere, to obtain a molten metal having a granular form, wherein the rotary disk has a diameter of 20 to 100 mm; and
   (c) rapidly cooling the molten metal having the granular form, to obtain the regenerator particles wherein the molten metal is cooled at such rate that temperature is lowered from 1000° C. to root temperature in 5 seconds or less.

9. The method of claim 8, wherein the molten metal is supplied through a jetting hole having a diameter of 0.05 to 2 mm.

10. The method of claim 8, wherein the rotary disk comprises a ceramic.

11. A method for manufacturing regenerator material particles comprising a rare-earth metal according to claim 1, the method comprising:
   (a) heating a metal comprising a rare-earth element, to obtain a molten metal, and preliminarily heating a rotary nozzle to a temperature of 800° C. or more;
   (b) jetting the molten metal from the rotary nozzle having a rotating velocity of 7000 to 11000 rpm in a chamber under an argon atmosphere, to obtain a molten metal having a granular form; and
   (c) rapidly cooling the molten metal having the granular form, to obtain the regenerator particles wherein the molten metal is cooled at such a rate that a temperature is lowered from 1000 ° C. to room temperature in 5 seconds or less.

12. The method of claim 11, wherein a diameter of a jetting hole in the rotary nozzle is 0.05 to 2 mm.

13. Rare-earth regenerator material particles, having:
   a particle size of 0.045 to 0.5 mm;
   a ratio of a long diameter to a short diameter of 2 or less; and
   a depressed portion having a length of ⅟₁₀ to ½ of a circumferential length on a particle surface and having a depth of ⅟₁₀ or less of a particle diameter, and the depressed portion has a channel-shape or a hole-shape, and
   wherein the number of depressed portion per one regenerator material particle is 1 or 2.

14. The particles of claim 13, comprising at least one selected from the group consisting of Nd, $Er_3Ni$, and $HoCu_2$.

15. The particles of claim 13, wherein the number of the depressed portion per one regenerator material particle is 2.

16. The particles of claim 13, wherein the number of the depressed portion per one regenerator material particle is 1.

* * * * *